(12) United States Patent
Blanchard

(10) Patent No.: US 6,399,961 B1
(45) Date of Patent: Jun. 4, 2002

(54) FIELD EFFECT TRANSISTOR HAVING DIELECTRICALLY ISOLATED SOURCES AND DRAINS AND METHOD FOR MAKING SAME

(75) Inventor: Richard A. Blanchard, Los Altos, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/657,765

(22) Filed: Sep. 8, 2000

Related U.S. Application Data

(62) Division of application No. 08/958,969, filed on Oct. 28, 1997, now Pat. No. 6,198,114.

(51) Int. Cl.[7] ............... H01L 31/112; H01L 27/01; H01L 27/12; H01L 31/0392
(52) U.S. Cl. .............................. 257/67; 257/347
(58) Field of Search .................... 257/67, 69, 347

(56) References Cited

U.S. PATENT DOCUMENTS

| | | | |
|---|---|---|---|
| 4,041,518 A | 8/1977 | Shimizu et al. ............... 357/23 |
| 4,353,085 A | 10/1982 | Sakurai ........................ 357/42 |
| 4,487,639 A | 12/1984 | Lam et al. .................. 148/175 |
| 4,523,213 A | 6/1985 | Konaka et al. ............. 357/23.7 |
| 4,609,407 A | 9/1986 | Masao et al. ................ 148/1.5 |
| 4,651,408 A | 3/1987 | MacElwee et al. ......... 29/576 J |
| 4,763,183 A | 8/1988 | Ng et al. .................... 357/23.7 |
| 4,862,232 A | 8/1989 | Lee ............................ 357/23.1 |
| 4,874,716 A | 10/1989 | Rao ............................... 437/43 |
| 4,879,255 A | 11/1989 | Deguchi et al. ............... 431/59 |
| 4,914,053 A | 4/1990 | Matyi et al. ................... 437/90 |
| 4,916,508 A | 4/1990 | Tsuamoto et al. ............. 437/59 |
| 4,966,861 A | 10/1990 | Mieno et al. .................. 437/99 |
| 5,110,757 A | 5/1992 | Arst et al. ..................... 437/89 |
| 5,172,203 A | 12/1992 | Hayashi ........................ 257/66 |
| 5,213,991 A | 5/1993 | Inokawa et al. ............... 437/41 |
| 5,338,697 A | 8/1994 | Aoki et al. .................... 437/40 |
| 5,347,151 A | 9/1994 | Shimizu et al. ............. 257/296 |
| 5,422,303 A | 6/1995 | Klose et al. ................... 437/89 |
| 5,498,567 A | 3/1996 | Klose et al. ................... 437/89 |
| 5,668,025 A | 9/1997 | Banchard .................... 438/207 |

FOREIGN PATENT DOCUMENTS

| | | |
|---|---|---|
| EP | 0 267 082 A1 | 5/1988 |
| JP | 56-11557 | 9/1981 |

Primary Examiner—Ngân V. Ngô
(74) Attorney, Agent, or Firm—David V. Carlson; Lisa K. Jorgenson

(57) ABSTRACT

A field-effect transistor and a method for its fabrication are described. The transistor includes a monocrystalline channel region extending from a monocrystalline body region of a semiconductor substrate. First and second source/drain regions laterally adjoin opposite sides of the channel region and are electrically isolated from the body region by an underlying first dielectric layer. The source/drain regions include both polycrystalline and monocrystalline semiconductor regions. A conductive gate electrode is formed over a second dielectric layer overlying the channel region. The transistor is formed by selectively oxidizing portions of a monocrystalline semiconductor substrate and then removing portions of the oxidized substrate. The resulting structure includes a body region of the substrate having overlying first and second oxide regions, with a protruding channel region extending from the body region between the oxide regions. Polycrystalline semiconductor material is then deposited under conditions conducive to partial epitaxial growth. A planarizing process then exposes a surface structure in which the first and second part-polycrystalline, part-monocrystalline semiconductor source/drain regions laterally adjoin opposite sides of the monocrystalline channel region. Additional process steps then provide the gate dielectric and gate electrode regions, desired doping levels, an interlevel covering dielectric, metallization contacts, etc.

10 Claims, 3 Drawing Sheets

US 6,399,961 B1

FIELD EFFECT TRANSISTOR HAVING DIELECTRICALLY ISOLATED SOURCES AND DRAINS AND METHOD FOR MAKING SAME

This application is a continuation of application Ser. No. 08/958,969, filed Oct. 28, 1997, now U.S. Pat. No. 6,198,114.

TECHNICAL FIELD

This invention relates generally to integrated circuit devices and their fabrication, and more particularly, to integrated circuit transistors and methods for their fabrication.

BACKGROUND OF THE INVENTION

A number of potential problems are caused by the high circuit element density of today's integrated circuits. For example, densely packed field-effect transistors have relatively short channel lengths, resulting in increased potential for punchthrough effects. Also, the correspondingly shallow drain and source junction depths can result in junction spiking, in which metallization layers penetrate drain and source diffusions. The short channel lengths also result in higher electric field strengths, which in turn cause deleterious hot carrier effects. Reduced device geometries increase capacitive coupling between source/drain regions and the body of the transistor, resulting in degraded device performance and signal transmission characteristics. In the case of CMOS technology, parasitic thyristors and associated latchup effects arise. These and other fundamental problems must be addressed by the circuit designer and process engineer.

SUMMARY OF THE INVENTION

In accordance with an embodiment of the present invention, a transistor is provided having first, second, and third semiconductor regions. The first region is a substantially monocrystalline semiconductor region of a first conductivity type protruding from a body region of a semiconductor substrate. A dielectric region overlies the body region and substantially laterally adjoins the first region. The second and third regions are semiconductor regions of a second conductivity type overlying the dielectric region and substantially laterally adjoining the first region. The second and third regions include both substantially polycrystalline and substantially monocrystalline semiconductor material.

In another embodiment, a field-effect transistor is provided. The transistor includes a monocrystalline semiconductor body region, with a monocrystalline semiconductor channel region extending therefrom. First and second semiconductor source/drain regions laterally adjoin the channel region and are substantially electrically isolated from the body region. The transistor may include a dielectric region underlying the source/drain regions to electrically isolate these regions from the body region. The source/drain regions may include substantially polycrystalline semiconductor material and substantially monocrystalline semiconductor material. The transistor may include a conductive gate electrode region proximate to and electrically coupled with the channel region. The transistor may further include a dielectric region adjacent the channel region, with the conductive gate electrode region adjacent to the dielectric region and capacitively coupled with the channel region.

In accordance with an embodiment of the present invention, a method of fabricating an integrated circuit device is provided. The method includes forming a substantially monocrystalline semiconductor substrate having a body region and a protruding region extending from the body region. An electrical isolation region is then formed which overlies the body region. An additional semiconductor region is formed which overlies the isolation region and laterally adjoins the protruding region. Forming the electrical isolation region may include forming a dielectric layer overlying the body region and laterally adjacent to the protruding region. The formation of the additional semiconductor region may include formation of a substantially polycrystalline semiconductor layer or may include formation of a substantially monocrystalline semiconductor epitaxial region. The formation of the body region and the protruding region may be accomplished by selectively removing portions of the semiconductor substrate. The removal of portions of the semiconductor substrate may include selective oxidation of portions of the semiconductor substrate.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known features associated with integrated circuit transistors—as well as the processes for their fabrication—have not been shown or described in detail, to avoid unnecessarily obscuring the description of the embodiments of the invention.

Figure 1:
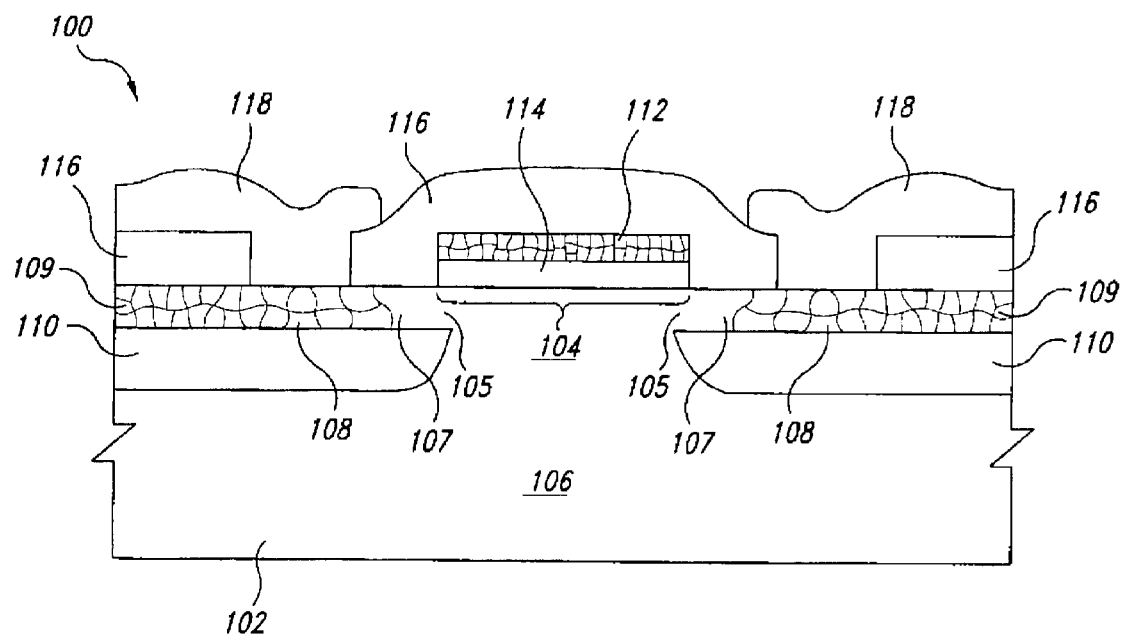
FIG. 1 is a cross-sectional view depicting a field-effect transistor in accordance with an embodiment of the present invention.

FIG. 1 depicts a transistor 100 in accordance with an embodiment of the present invention. In this embodiment, the transistor 100 is a field-effect transistor formed on a semiconductor substrate 102. The substrate 102 is preferably a lightly doped monocrystalline silicon, but may be any of a variety of suitable semiconductor materials, such as germanium, diamond, silicon carbide, silicon-germanium alloy, or gallium arsenide, as appropriate for desired device characteristics. The transistor 100 includes a monocrystalline semiconductor channel region 104, which is a protruding portion of the substrate 102 and extends from a body region 106 of the substrate. For purposes of this description, and as will be clear to those skilled in the art, the term "channel region" shall mean that semiconductor region in which, for example, a conducting channel can be induced or depleted in an enhancement or depletion mode field-effect transistor, respectively. Further, the term "body region" shall mean that semiconductor region or portion of the substrate that is substantially contiguous with, underlying, and/or proximate to the channel region.

The channel region 104 is positioned between and contiguous with source/drain regions 108, which overlie electrical isolation regions such as dielectric regions 110, which substantially electrically isolate the source/drain regions from the body region 106 of the substrate 102. The source/drain regions 108 are preferably formed from silicon, but may be any of a wide variety of suitable semiconductor materials, whether substantially the same as or otherwise matched to the selected material from which the channel region 104 is made. The channel region 104 itself may extend laterally to include regions 105 that partly overlap the dielectric regions 110. The source/drain regions 106 may include monocrystalline semiconductor regions 107 and/or polycrystalline semiconductor regions 109.

The source/drain regions 108 and the channel region 104 are of relative conductivity types appropriate to the particular transistor type. In the case of an insulated gate enhancement mode field-effect transistor, for example, the source/drain regions 108 and the channel region 104 are of opposite conductivity types. The dielectric regions 110 are preferably silicon-dioxide, but may be silicon-nitride or other suitable insulating materials deposited or otherwise formed on or within the surface region of the body region 106 of the substrate 102. The dielectric regions 110 substantially electrically isolate the source/drain regions 108 from the underlying body region 106.

FIG. 1 depicts the transistor 100 as an insulated gate field-effect transistor, with a gate electrode 112 capacitively coupled by a gate dielectric layer 114 with the channel region 104. In one embodiment, the gate electrode 114 partially laterally overlaps the dielectric regions 110, corresponding to the regions 105 of the channel region 104 which partly overlap these dielectric regions. Those skilled in the art will appreciate, however, that a number of alternative gate electrode geometries and configurations may be employed. An interlevel dielectric 116 covers substantially all of the transistor 100, with electrical connections to the source/drain regions 108 provided by conductive electrodes such as patterned metal contacts 118. A related transistor architecture and fabrication process is described in U.S. Pat. No. 5,668,025, issued Sep. 16, 1997, the specification of which is incorporated herein by reference.

Figure 2:
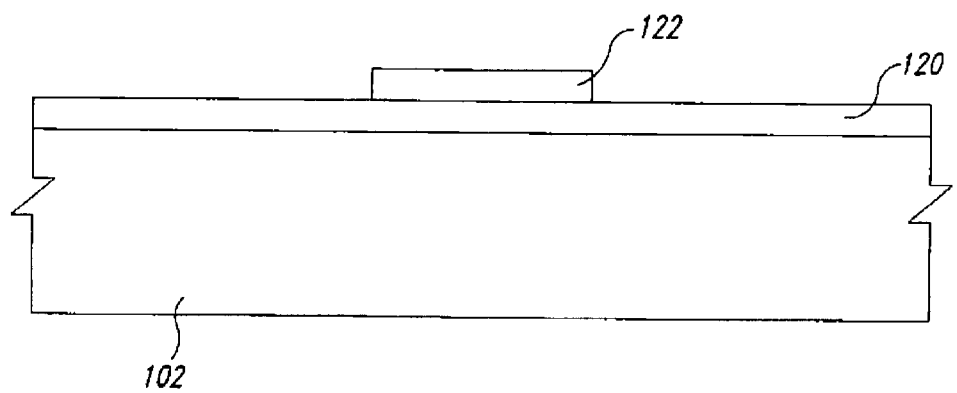
FIGS. 2–6 are cross-sectional views depicting selected steps during fabrication of the transistor depicted in FIG. 1.
Figure 3:
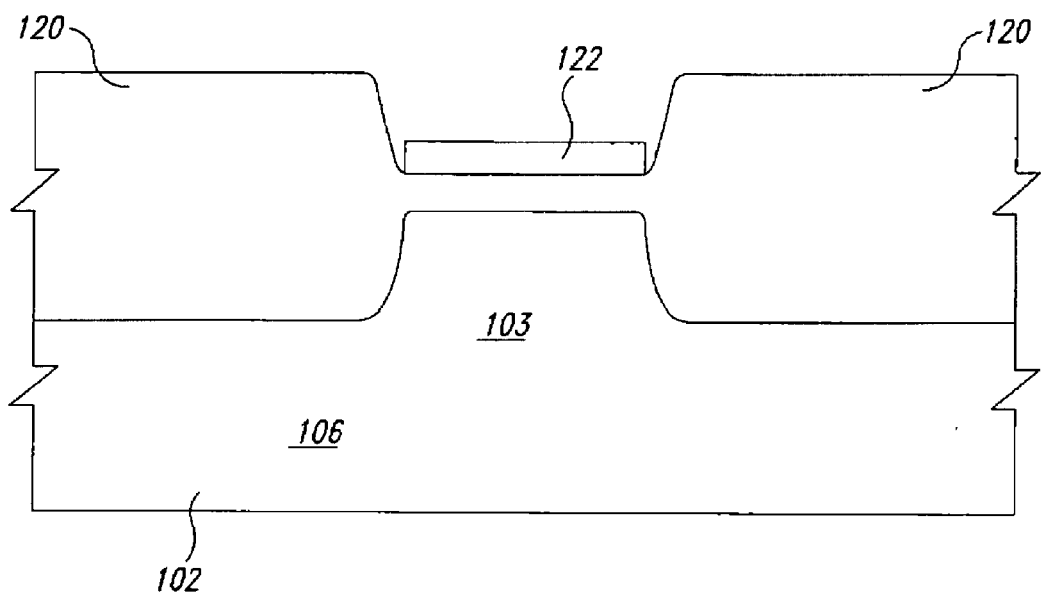

FIGS. 2–6 highlight certain process steps used for fabrication of the transistor 100 of FIG. 1. FIG. 2, for example, depicts the semiconductor substrate 102 with a dielectric layer 120 such as silicon dioxide having been grown thereon. A patterned mask layer 122 such as silicon nitride overlies the dielectric layer 120 for use in further process steps. As shown in FIG. 3, the dielectric layer 120 is grown to considerably greater extent on those portions of the substrate 102 not covered by the mask layer 122. One example implementation of the process steps depicted in FIGS. 2 and 3 is the growth of LOCOS field oxide on a silicon substrate patterned with an oxide/nitride active stack.

Figure 4:
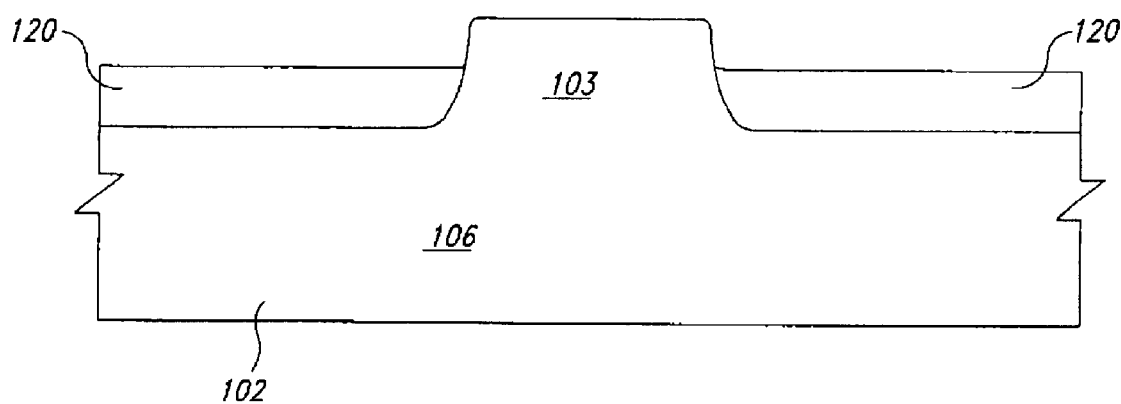

As a consequence of the selective growth of the dielectric layer within and on the surface of the substrate 102, the resulting structure of the substrate includes the body region 106 from which a protruding region 103 extends. As shown in FIG. 4, removal of the mask layer 122 and portions of the dielectric layer 120, by any of a variety of suitable methods, then exposes portions of the protruding region 103, while leaving some remaining portions of the dielectric layer 120 overlying the body region 106. Selective oxidation of the substrate 102, followed by removal of portions of the oxidized substrate is one particular example of, more generally, selective removal of portions of the substrate. Those skilled in the art will appreciate that a wide variety of alternative methods (as appropriate to silicon or other semiconductor substrates) may be employed to form the structure in which the protruding region 103 extends from the body region 106 of the substrate 102.

Figure 5:
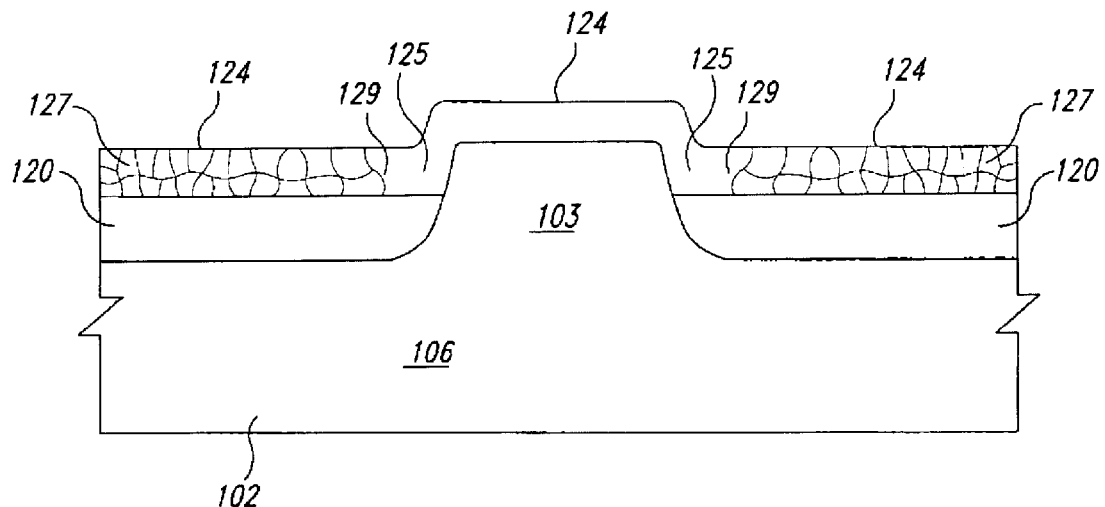

Referring to FIG. 5, additional semiconductor material 124 is deposited, grown, or otherwise formed on the remaining portions of the dielectric layer 120 and the protruding region 103. The additional semiconductor material 124 is formed under such conditions as to promote selective epitaxial crystal growth in some regions and formation of polycrystalline structures in other regions. If the additional semiconductor material is silicon, it is preferably formed with a thickness of approximately 1000 Å, or more generally in the range 400–4000 Å, and in a temperature range of 800–1000° C. Alternatively, high temperature, laser or electron-beam annealing and recrystallization methods may be employed. In this way, the additional semiconductor material 124 includes substantially monocrystalline semiconductor regions 125 that partially laterally overlap the dielectric layer 120.

The formation rate, time, temperature and other parameters associated with the formation of the additional semiconductor material 124 are selected to ensure that the regions 125 of the additional semiconductor material have the same monocrystalline structure as the substrate 102 itself. The additional semiconductor material 124 may also include portions 127 that have a substantially polycrystalline structure. The size and extent of the monocrystalline regions 125 are controlled by selection and control of the formation parameters. In one embodiment, the formation parameters are controlled so that the monocrystalline regions 125 extend only a short distance over the dielectric layer 120. In an alternative embodiment, the formation parameters are controlled so as to enlarge the size of the monocrystalline region 125 so it will extend essentially over the entire dielectric layer 120. When both monocrystalline regions 125 and polycrystalline regions 127 are present in the additional semiconductor material 124, transition regions 129 exist between the monocrystalline and polycrystalline regions. Selection and control of formation parameters allows selection of the location of the transition regions 129, as desired. The location of the transition regions 129 will likely be symmetrical with respect to the monocrystalline regions 125, but need not be so.

Figure 6:
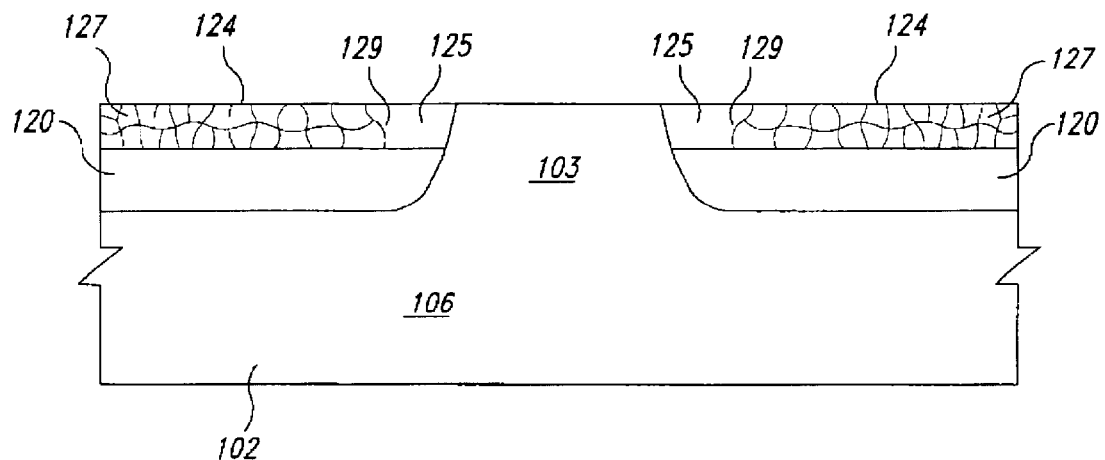

Subsequently, a polishing or other suitable planarizing process is performed to produce the structure shown in FIG. 6, in which a surface portion of the protruding region 103 is exposed together with first and second remaining portions of the semiconductor material 124 laterally adjoining the protruding region. Further processing of the remaining portions of the semiconductor material 124 will form the source/drain regions 108 and regions 105 of the channel region 104, and the remaining portions of the dielectric layer 120 form the dielectric regions 110, shown in the transistor 100 of FIG. 1.

Additional process steps (well known to those skilled in the art) are performed to provide threshold voltage adjust implants, formation of the gate dielectric 114 and gate electrode 112, appropriate doping of the source/drain regions 108, interlevel dielectric 116, and metallization contacts 118 shown in FIG. 1. Doping of the semiconductor material 124 might include, in the case of CMOS applications (not shown), regions that are doped N-type and P-type, as well as undoped intrinsic regions suitable for providing resistors. Source/drain implantation could be done as a two-step process, using sidewall dielectrics for self-aligned masking of the second implant, as is conventionally done to form lightly-doped drain (LDD) regions.

The size and extent of the gate dielectric 114 and gate electrode 112 shown in FIG. 1 may be selected according to a variety of desired design parameters and device characteristics. In one embodiment, for example, the gate dielectric 114 and electrode 112 extend laterally for a selected distance beyond the protruding region 103 (see FIG. 6) of the substrate 102 to assure formation of the source/drain regions 108 exclusively overlying the dielectric regions 110.

The size and extent of the gate dielectric 114 and gate electrode 112 may also be selected according to the location of the transition region 129 from the monocrystalline portion 125 to the polycrystalline portion 127 of the additional semiconductor material 124. The gate electrode 112 may be substantially aligned with the transition region 129 between the monocrystalline regions 125 and polycrystalline regions 127 of the additional semiconductor material 124. In this case, the source/drain regions 108 are essentially formed in polycrystalline material only and the channel region 104 is in monocrystalline material, with polycrystalline source/drain regions laterally abutting and directly adjacent to a monocrystalline channel region. In a further embodiment, a portion or a majority of the source/drain regions 108 may be formed in monocrystalline material positioned over the dielectric regions 110. A portion of the channel region 104 may itself be over the dielectric regions 110. In still other embodiments a smaller channel region may be desired, in which case the gate electrode 112 does not extend so far as to overlap the dielectric regions 110.

The above-described structure of the transistor 100 and the process steps for its fabrication can be readily adapted to a wide variety of applications, such as CMOS, DMOS, JFET, and BiCMOS technologies. Such adaptations will be apparent to those skilled in the art, and are therefore not shown or described. Adaptations to CMOS applications may be particularly advantageous. In such case, the body region 106 described above is formed in a well region. Threshold voltage adjust implants are provided to the channel region 104, and the electrical function of the well regions is less important than in current CMOS architectures. In accordance with described embodiments of the present invention, the electrical function of the CMOS well regions is substantially only to provide back biasing. Thus, the depth and doping of the wells is less critical than in conventional CMOS processes, and such parameters can be optimized for other applications—such as to optimize gain and breakdown characteristics of bipolar devices in BiCMOS or bipolar/CMOS/DMOS processes.

The device structure of the above-described embodiments could be used for one of the device types in a CMOS integrated circuit. For example, PMOS devices could be constructed in accordance with above-described embodiments, whereas NMOS devices could be constructed conventionally. Substantial removal of the just the PMOS devices from the substrate is sufficient to inhibit latchup effects, and the PMOS and NMOS devices could be partly overlapped to provide significant advantages in density. Still further advantages in density are provided by improved tolerance to contact misalignment. Conventional process design rules selected to avoid misaligned contacts to active areas and to polysilicon-over-active areas may be considerably relaxed in embodiments of the present invention.

Those skilled in the art will appreciate a number of advantages achieved in accordance with the above-described embodiments of the present invention. For example, problems associated with latchup are essentially negligible, since the source/drain regions 108 (and even portions of the channel region 104) of the transistor 100 are physically separated from the body region 106 (i.e., the corresponding well region in CMOS devices) of the substrate 102 by the dielectric regions 110. Also, prior art problems associated with junction spiking are avoided, since the source/drain regions 108 overlie the dielectric region 110. In this case, any penetration of the metal 118 through the source/drain regions 108 is stopped by the dielectric material 110, and shorting to the body region 106 of the substrate 102 is prevented. The relatively slower drift velocity of carriers in polycrystalline semiconductor material ameliorates hot carrier effects. The dielectric separation of the source/drain regions (and portions of the channel region 104) from the substrate significantly reduces capacitive coupling effects. Punchthrough is largely avoided, since significant depletion regions cannot form in the substrate. A further advantage is provided by the ready etchability of polycrystalline semiconductor material—allowing the lateral spacing between source/drain regions of adjacent transistors to be considerably reduced, and thereby improving circuit element density. Circuit element density may also be increased due to the requirement that only the protruding region 103 need be photolithographically defined in the substrate 102, in contrast to conventional definition of active areas intended to include channel, source, and drain regions.

It will be appreciated that, although embodiments of the invention have been described above for purposes of illustration, various modifications may be made without deviating from the spirit and scope of the invention. For example, while the above-described embodiments relate to field-effect transistor structures, those skilled in the art will appreciate that bipolar and other types of transistors may be encompassed within the scope of the invention. Accordingly, the scope of the invention is not limited by the disclosure of the particular embodiments, and terms used in the following claims should not be construed to limit the invention to these embodiments. Instead, the scope of the invention is determined entirely by the following claims.

What is claimed is:

1. A field-effect transistor, comprising:
a semiconductor substrate material having a dopant with a doping concentration and a doping profile;
a monocrystalline semiconductor body mesa region, being composed of substrate material and extending above adjacent portions of the semiconductor substrate material and having at least one dopant having the same concentration and doping profile as the substrate material;
a monocrystalline semiconductor channel region being a part of the body mesa region;
semiconductor source/drain regions, said semiconductor channel region being substantially lateral and having a flat upper surface, the semiconductor source/drain regions adjoining first and second portions of the channel region, respectively, the semiconductor source and drain regions each having a polycrystalline semiconductor region;
a gate oxide positioned on top of the monocrystalline semiconductor channel region, the gate oxide being substantially flat and having uniform thickness; and
an electrical isolation region of substantially uniform thickness being partially overlapped by the first and second portions of the channel region, respectively, the electrical isolation region positioned adjacent the semiconductor source and drain region.

2. The transistor according to claim 1, wherein the electrical isolation region includes a dielectric region positioned between the source/drain regions and the body region.

3. The transistor according to claim 1 wherein the source/drain regions include substantially polycrystalline semiconductor material.

4. The transistor according to claim 1 wherein at least a portion of the source/drain regions include substantially monocrystalline semiconductor material.

5. The transistor according to claim 1, further comprising a conductive gate electrode region proximate to and electrically coupled with the channel region.

6. The transistor according to claim 1, further comprising:
 a dielectric region positioned adjacent to the channel region; and
 a conductive gate electrode region positioned adjacent to the dielectric region and capacitively coupled therethrough with the channel region.

7. A field-effect transistor, comprising:
 a semiconductor substrate material having a dopant with a doping concentration and a doping profile;
 a monocrystalline semiconductor body mesa region being composed of substrate material and extending above adjacent portions of the semiconductor substrate material region and having at least one dopant having the same concentration and doping profile as the substrate material;
 a monocrystalline semiconductor channel region being a part of the body region, being composed of substrate material and extending above adjacent portions of the semiconductor substrate material region and having at least one dopant having the same concentration and doping profile as the substrate material, said semiconductor channel region being substantially lateral and having a flat upper surface;
 a substantially flat dielectric region of substantially uniform thickness overlying the body region and partially underlying the channel region;
 a gate oxide positioned on top of the monocrystalline semiconductor channel region, the gate oxide being substantially flat and having uniform thickness;
 semiconductor source/drain regions overlying the dielectric region and laterally adjoining opposite sides of the channel region, the semiconductor source/drain regions each having a polycrystalline semiconductor region; and
 a conductive gate electrode region proximate to the channel region, and extending to overlap the dielectric region.

8. The transistor according to claim 7 wherein the dielectric region is a first dielectric region, and further comprising a second dielectric region overlying the channel region, and wherein the conductive gate electrode region overlies the second dielectric region.

9. The transistor according to claim 7 wherein the source/drain regions include substantially polycrystalline and substantially monocrystalline semiconductor material.

10. The field effect transistor according to claim 7 wherein the dielectric region includes a dielectric material that is a compound that includes some of the original substrate material in the compound.

* * * * *